United States Patent
Tanaka et al.

(10) Patent No.: US 10,355,408 B2
(45) Date of Patent: Jul. 16, 2019

(54) CONNECTOR HAVING LATCHES

(71) Applicant: FUJITSU COMPONENT LIMITED, Tokyo (JP)

(72) Inventors: Tetsugaku Tanaka, Tokyo (JP); Koki Sato, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 0 days.

(21) Appl. No.: 15/923,323

(22) Filed: Mar. 16, 2018

(65) Prior Publication Data
US 2018/0287298 A1  Oct. 4, 2018

(30) Foreign Application Priority Data

Mar. 31, 2017  (JP) .................... 2017-069528

(51) Int. Cl.
| | | |
|---|---|---|
| H01R 12/72 | (2011.01) | |
| H01R 13/629 | (2006.01) | |
| H05K 7/14 | (2006.01) | |
| H01R 12/70 | (2011.01) | |
| H01R 13/627 | (2006.01) | |
| H01R 13/633 | (2006.01) | |
| H01R 12/73 | (2011.01) | |

(52) U.S. Cl.
CPC ..... *H01R 13/62955* (2013.01); *H01R 12/721* (2013.01); *H01R 13/62966* (2013.01); *H05K 7/1409* (2013.01); *H01R 12/7029* (2013.01); *H01R 12/737* (2013.01); *H01R 13/6275* (2013.01); *H01R 13/6335* (2013.01)

(58) Field of Classification Search
None
See application file for complete search history.

(56) References Cited

U.S. PATENT DOCUMENTS

| | | | |
|---|---|---|---|
| 7,637,783 B2 | 12/2009 | Sasaoka et al. | |
| 8,092,239 B2 * | 1/2012 | Nishiyama | H01R 12/7005 439/157 |
| 8,753,138 B2 * | 6/2014 | Foster, Sr. | H01R 12/7029 439/160 |
| 9,325,090 B2 * | 4/2016 | Shen | H01R 12/721 |

FOREIGN PATENT DOCUMENTS

| | | |
|---|---|---|
| JP | 2006-202615 | 8/2006 |
| JP | 2009-199766 | 9/2009 |

* cited by examiner

*Primary Examiner* — Tho D Ta
(74) *Attorney, Agent, or Firm* — IPUSA, PLLC

(57) ABSTRACT

A connector includes a connector body including an opening to which a substrate is to be inserted; guide posts provided at both sides of the connector body; and latches being rotatably connected to the guide posts, respectively, wherein each of the latches includes a lock plate configured to support the substrate from both surfaces of the substrate, when the substrate is inserted in the opening, and a presser configured to enter a notch provided at a side of the connector body.

7 Claims, 20 Drawing Sheets

FIG.7A
FIG.7B
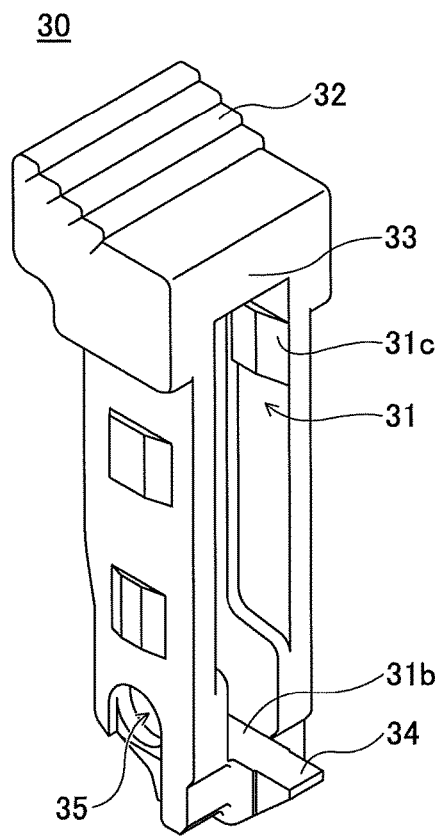
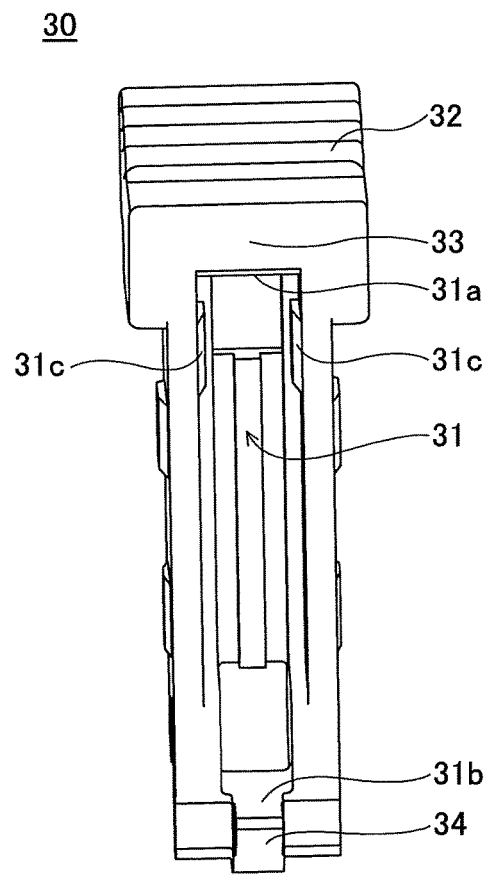

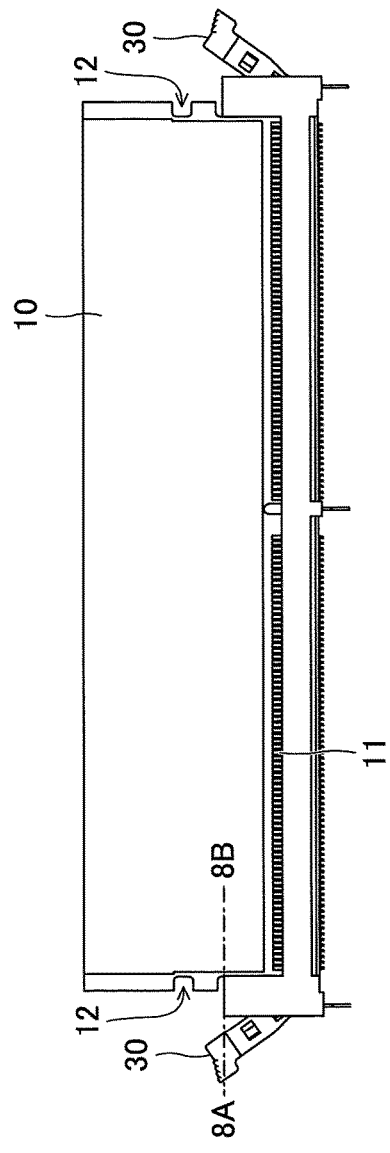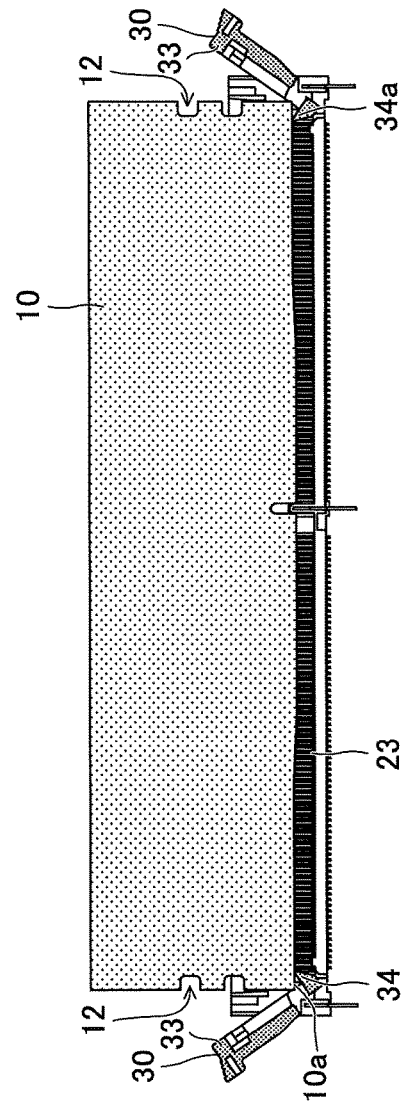

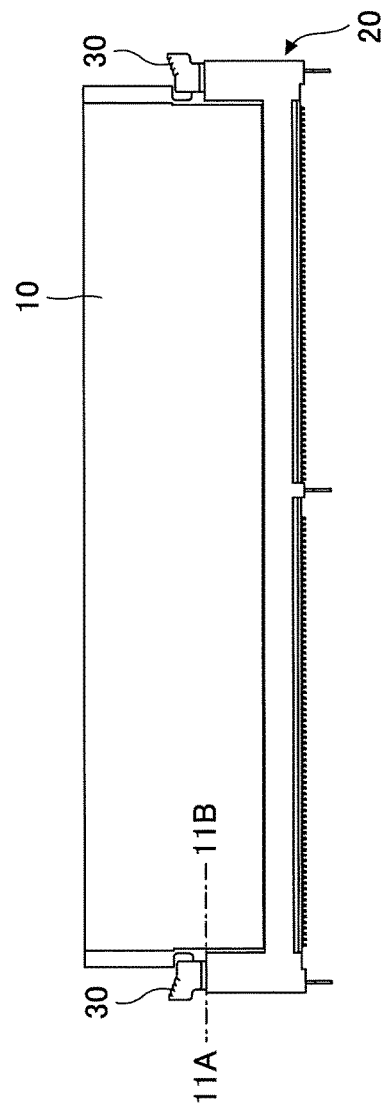
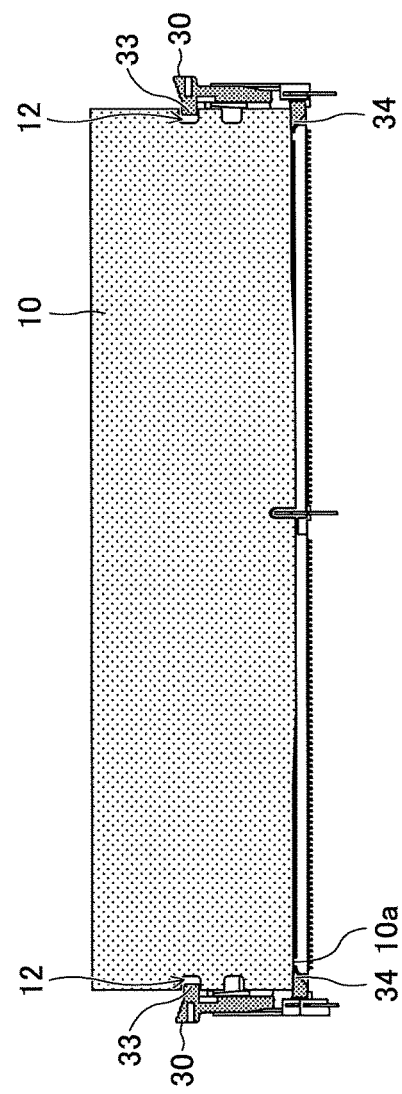

CONNECTOR HAVING LATCHES

CROSS-REFERENCE TO RELATED APPLICATION

The present application is based on and claims the benefit of priority of Japanese Priority Application No. 2017-069528 filed on Mar. 31, 2017, the entire contents of which are hereby incorporated by reference.

BACKGROUND

1. Field of the Invention

The present invention relates to a connector.

2. Description of the Related Art

Recently, personal computers and the like are widely spread as information devices, and semiconductor memories are used as recording media in such personal computers. The semiconductor memories are mounted on a substrate that is attached to a motherboard of a personal computer. Thus, a connector called a card edge connector for attaching the substrate is provided at the motherboard. Electrode pads are provided at an edge of the substrate, and the substrate is attached to the card edge connector by inserting the substrate to the card edge connector.

Meanwhile, fans are provided in the personal computer such as a fan for cooling a CPU (Central Processing Unit), a fan attached to a graphics board, or a fan for cooling an inner portion of a housing. When these fans are operated while the personal computer is activated, vibration is generated in the personal computer, and the vibration is transmitted to the card edge connector and the substrate. If the electrode pads of the substrate and contact terminals of the card edge connector are momentarily electrically disconnected due to such vibration, that may affect an operation of the personal computer and is not preferable. Further, this is the same for a case when a strong impact or the like is applied to the personal computer.

Thus, a card edge connector is required by which electrode pads of a substrate and contact terminals of a card edge connector are not electrically disconnected even when vibration is generated in the personal computer or an impact is applied to the personal computer.

[Patent Documents]

Patent Document 1: Japanese Laid-open Patent Publication No. 2006-202615

Patent Document 2: Japanese Laid-open Patent Publication No. 2009-199766

SUMMARY OF THE INVENTION

According to an embodiment, there is provided a connector including a connector body including an opening to which a substrate is to be inserted; guide posts provided at both sides of the connector body; and latches being rotatably connected to the guide posts, respectively, wherein each of the latches includes a lock plate configured to support the substrate from both surfaces of the substrate, when the substrate is inserted in the opening, and a presser configured to enter a notch provided at a side of the connector body.

BRIEF DESCRIPTION OF THE DRAWINGS

Other objects, features and advantages of the present invention will become more apparent from the following detailed description when read in conjunction with the accompanying drawings.

FIG. 7A and FIG. 7B are views for describing the latches;

FIG. 8A and FIG. 8B are views for describing steps of attaching the substrate to the card edge connector;

FIG. 11A and FIG. 11B are views for describing the steps of attaching the substrate to the card edge connector;

DESCRIPTION OF THE EMBODIMENTS

Figure 1A:
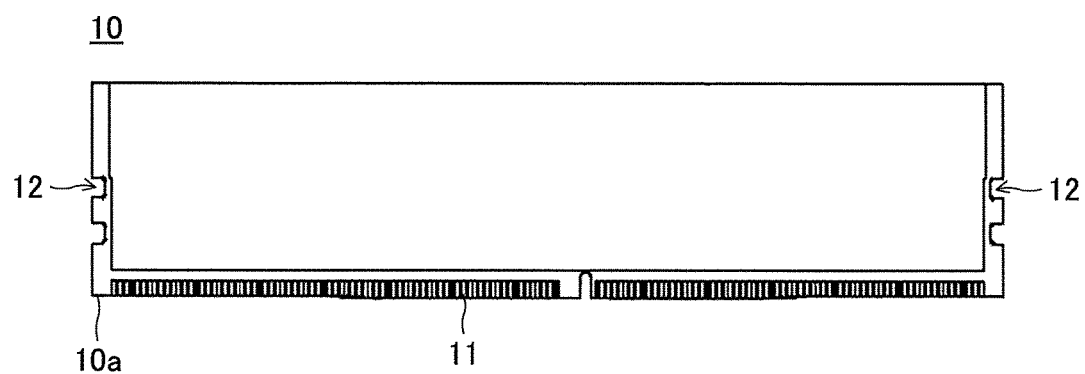
FIG. 1A and FIG. 1B are views for describing a module substrate.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

First, a module substrate on which a semiconductor memory is mounted and a card edge connector are described. The card edge connector is attached to a motherboard of a personal computer by soldering or the like. The module substrate is attached to the card edge connector by being inserted therein.

Figure 1B:
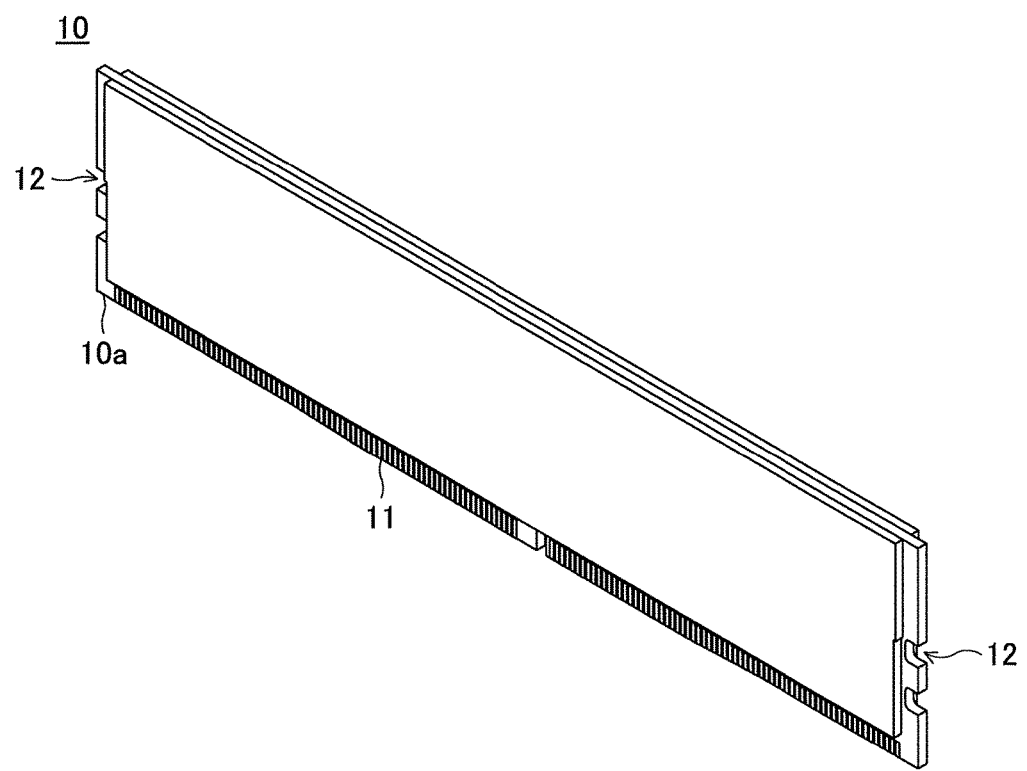

FIG. 1A is an elevation view of a module substrate 10, and FIG. 1B is a perspective view of the module substrate 10. A board body of the module substrate 10 is made of an insulating material such as a glass epoxy resin. Semiconductor device(s) and electronic component(s), not illustrated, are mounted on one surface or both surfaces of the board body.

The semiconductor devices mounted on the module substrate 10 are semiconductor memories such as a DRAM (Dynamic Random Access Memory). Electrode pads 11 are provided near a lower end 10a of the module substrate 10.

The electrode pads 11 are connected to electrode terminals of the semiconductor devices attached to the module substrate 10. The electrode pads 11 are formed at a surface of the board body.

Further, notches 12, being formed to be concaved, are provided at middle of each side of the module substrate 10. The thickness of the board body of the module substrate 10 may be 1.3 mm to 1.5 mm.

Before describing a card edge connector of an embodiment, a general card edge connector is described. FIG. 2A to FIG. 5 are views illustrating a general card edge connector 20.

The card edge connector 20 includes a connector body 21, guide posts 24 and latches 30. The guide posts 24 are provided at both sides of the connector body 21 to extend upward, respectively. Each of the guide posts 24 has a square pole shape. The latches 30 are provided inside the guide posts 24 so that the latches 30 are also provided at both sides of the connector body 21, respectively.

Figure 2A:
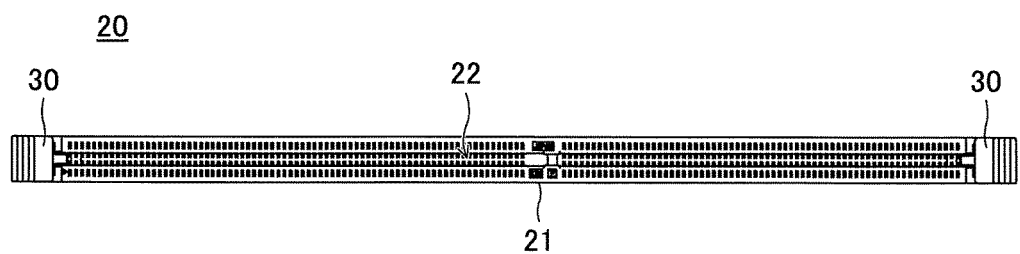
FIG. 2A and FIG. 2B are views illustrating a card edge connector in which latches are closed.
Figure 2B:
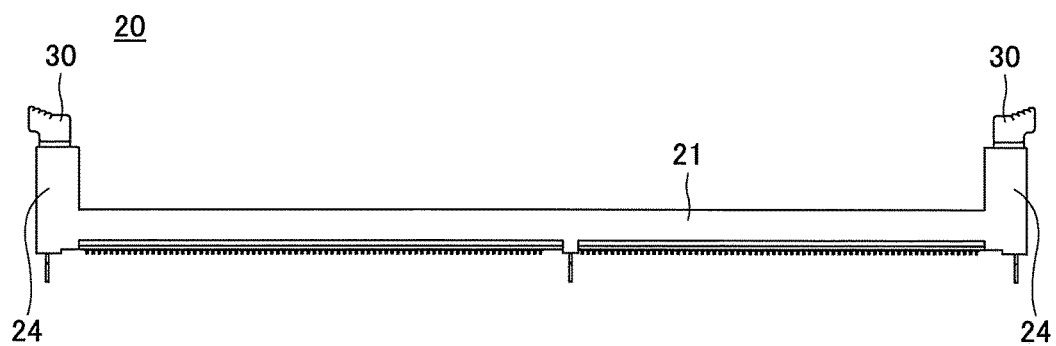
Figure 3:
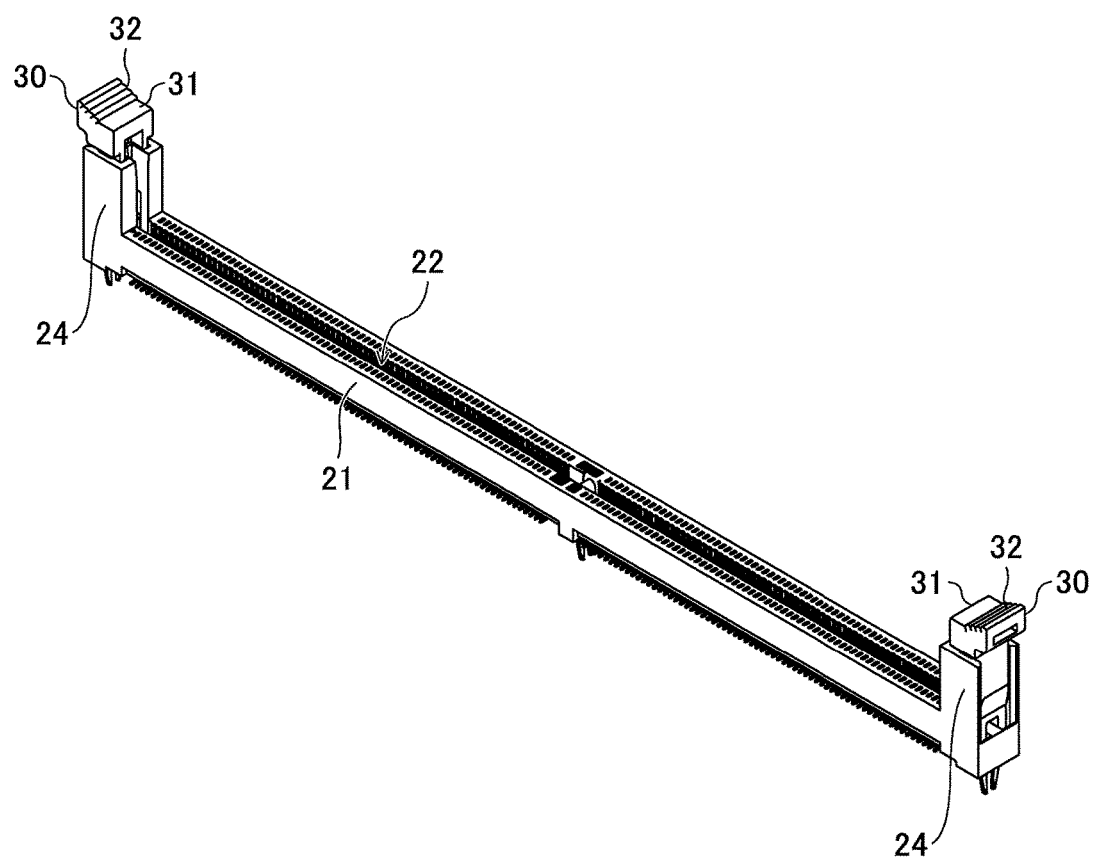
FIG. 3 is a perspective view of the card edge connector in which the latches are closed.
Figure 4A:
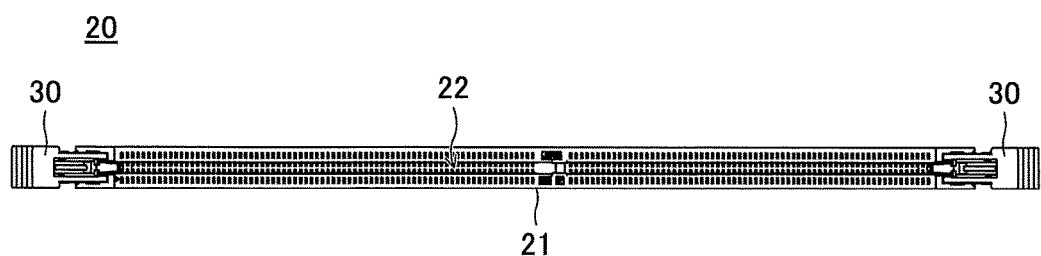
FIG. 4A and FIG. 4B are views illustrating the card edge connector in which the latches are opened.
Figure 4B:
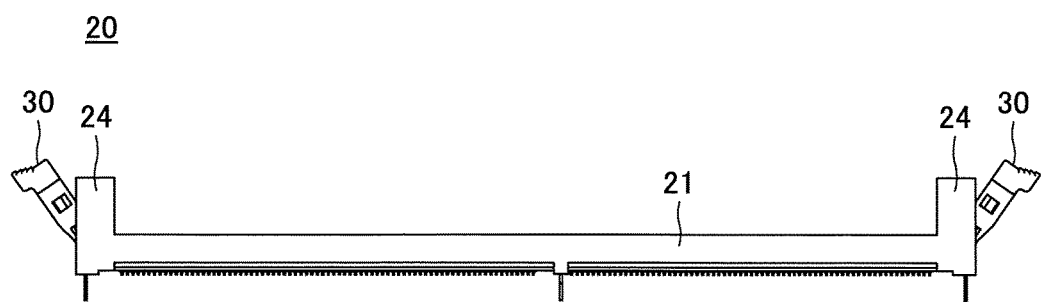
Figure 5:
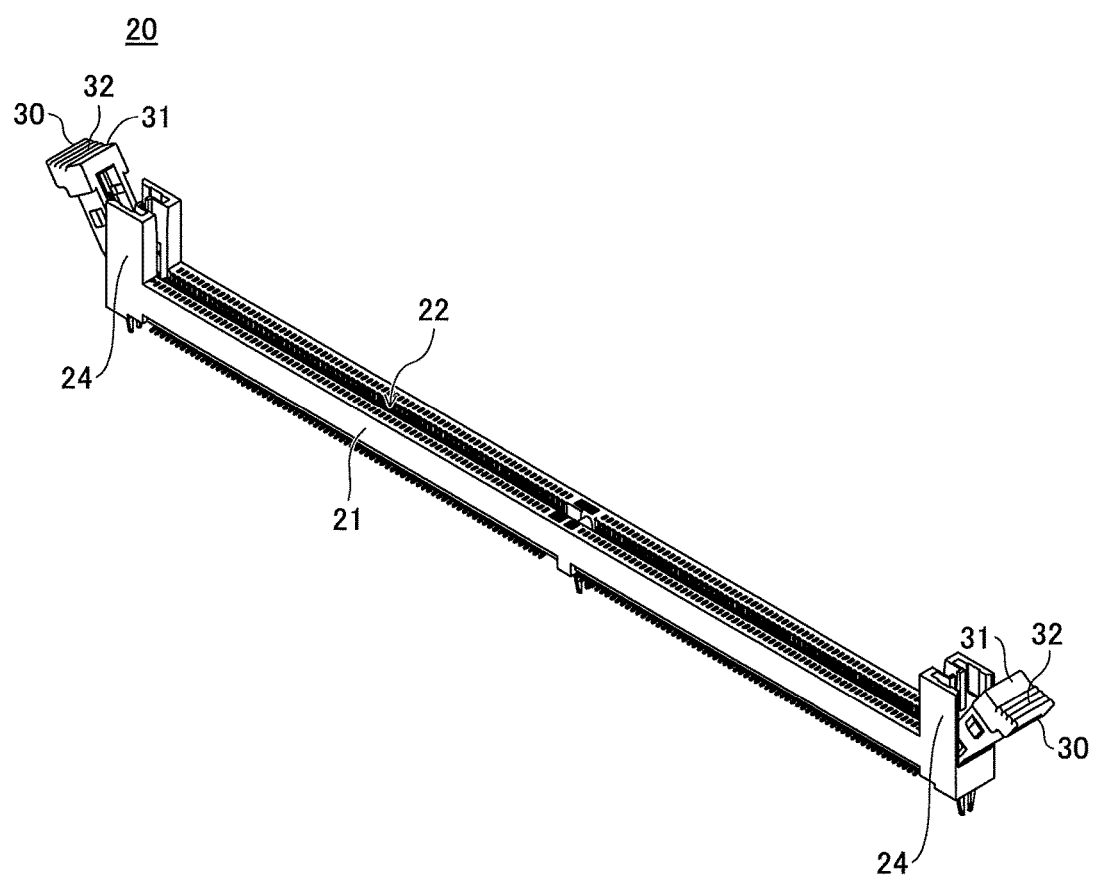
FIG. 5 is a perspective view of the card edge connector in which the latches are opened.

FIG. 2A to FIG. 3 illustrate a state in which the latches 30 are closed. FIG. 2A is a top view, FIG. 2B is an elevation view and FIG. 3 is a perspective view, of the card edge connector 20. FIG. 4A to FIG. 5 illustrate a state in which the latches 30 are opened. FIG. 4A is a top view, FIG. 4B is an elevation view and FIG. 5 is a perspective view, of the card edge connector 20.

Further, an opening 22 to which the module substrate 10 is introduced is provided at the connector body 21. As will be described later, contact terminals corresponding to the electrode pads 11 of the module substrate 10 are provided at the opening 22.

Figure 6A:
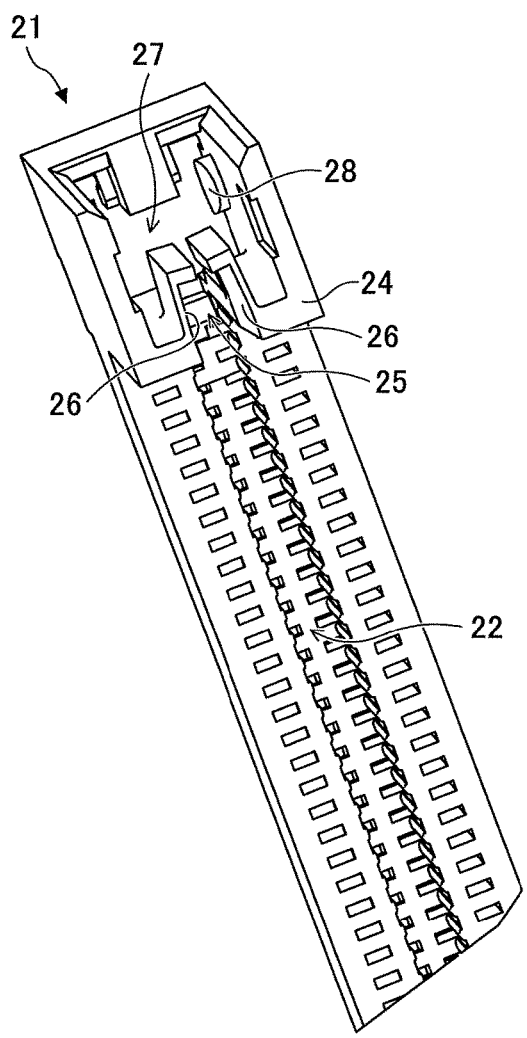
FIG. 6A and FIG. 6B are enlarged views of a connector body of the card edge connector.
Figure 6B:
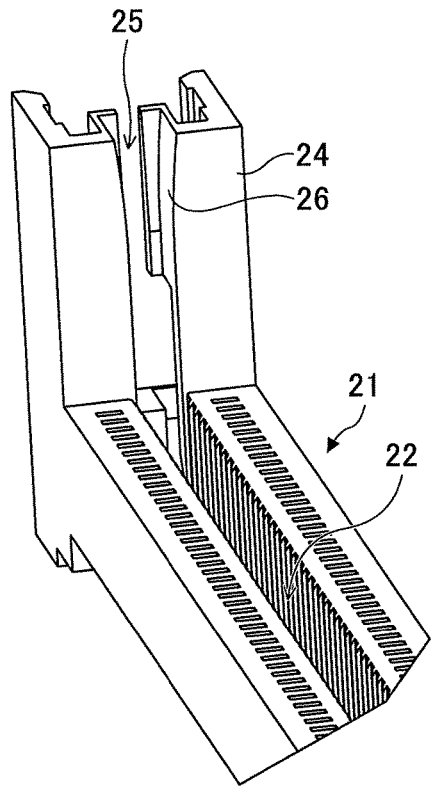

FIG. 6A and FIG. 6B are perspective views illustrating a portion of the connector body 21 of the card edge connector 20.

A guide groove 25 that guides the module substrate 10 introduced into the opening 22 is provided at each of the guide posts 24. Guide sidewalls 26 are provided at both sides of the guide groove 25. In other words, the guide groove 25 is sandwiched by the sidewalls 26 at the both sides. The guide groove 25 is provided at an inner side surface of the guide post 24, in other words, the guide grooves 25 are formed to face with each other. Lower sides of the guide grooves 25 are in communication with the opening 22. When the module substrate 10 is inserted in the guide grooves 25 and the opening 22, the module substrate 10 is attached to the card edge connector 20. Further, the guide groove 25 is formed to have wider width at its upper side so that the module substrate 10 can be easily inserted in the guide groove 25. In other words, a distance between the sidewalls 26 are gradually increasing upwardly at the upper side of the guide groove 25.

A space that functions as an installation portion 27 to which the latch 30 is introduced is provided in the guide post 24. A shaft 28 that rotatably supports the latch 30 is provided in the installation portion 27. Thus, an outer side of the guide post 24 that is an opposite side of the surface where the guide groove 25 is provided is open so that the latch 30 can be operated.

Next, the latch 30 is described with reference to FIG. 7A and FIG. 7B. FIG. 7A is a perspective view and FIG. 7B is a side view, of the latch 30.

The latch 30 includes an operation portion 32, a presser 33, a concave portion 31, a support 34 and a concave portion 35. The operation portion 32 is provided at an upper side of the latch 30. The concave portion 31 is provided at a center of a side surface of the latch 30. The concave portion 31 has a substantially rectangular shape. The concave portion 31 is configured to receive the side of the module substrate 10 along the short direction of the module substrate 10.

The presser 33 is provided between the operation portion 32 and an upper surface 31a of the concave portion 31, and is configured to enter the notch 12 of the module substrate 10 that is inserted in the concave portion 31.

The support 34 is configured to support the lower end 10a of the module substrate 10 when the module substrate 10 is inserted in the concave portion 31. The support 34 is formed to protrude along a bottom surface 31b of the concave portion 31.

The concave portion 35 has a circular concaved shape and is provided at an outer lower portion of the latch 30. The latch 30 is attached to the connector body 21 when the shaft is introduced in the concave portion 35. Thus, the latch 30 can rotate around the concave portion 35 in which the shaft 28 is introduced as an axis.

When attaching the module substrate 10 to the card edge connector 20 under a state that the latches 30 are opened as illustrated in FIG. 4A to FIG. 5, a lower end 10a of the module substrate 10 at which the electrode pads 11 are provided is inserted in the opening 22.

Figure 9:
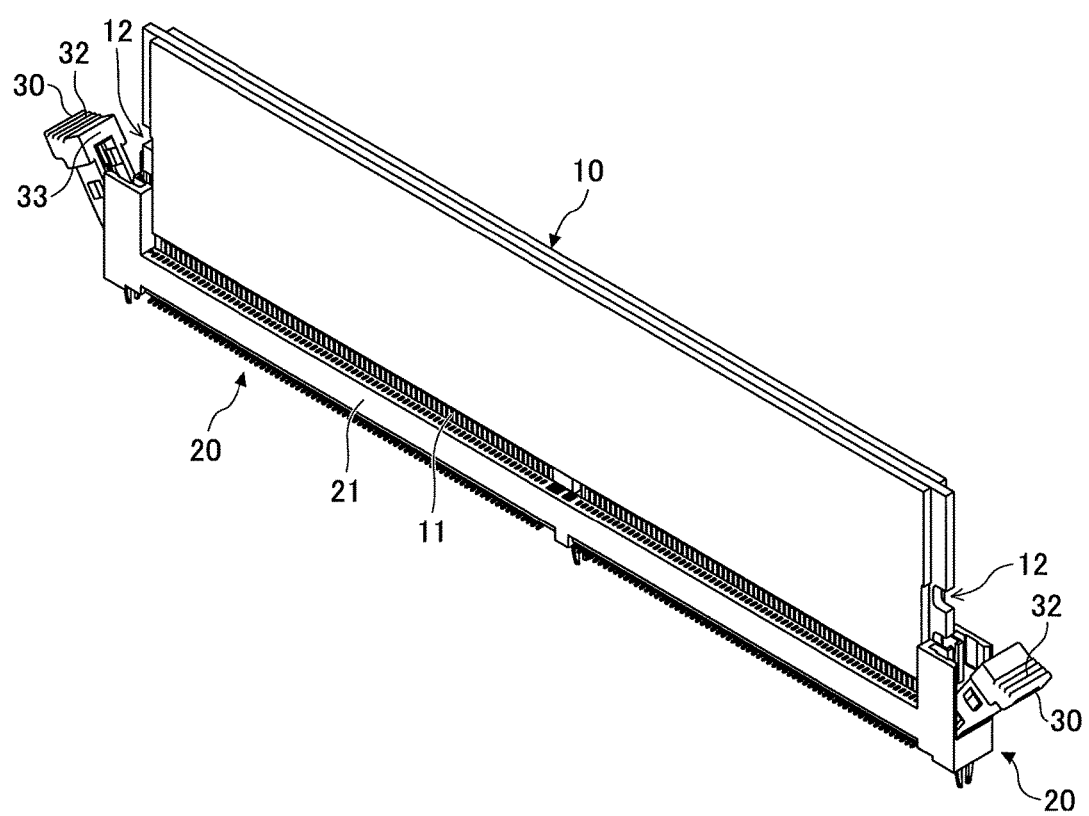
FIG. 9 is a view for describing the step of attaching the substrate to the card edge connector.
Figure 10:
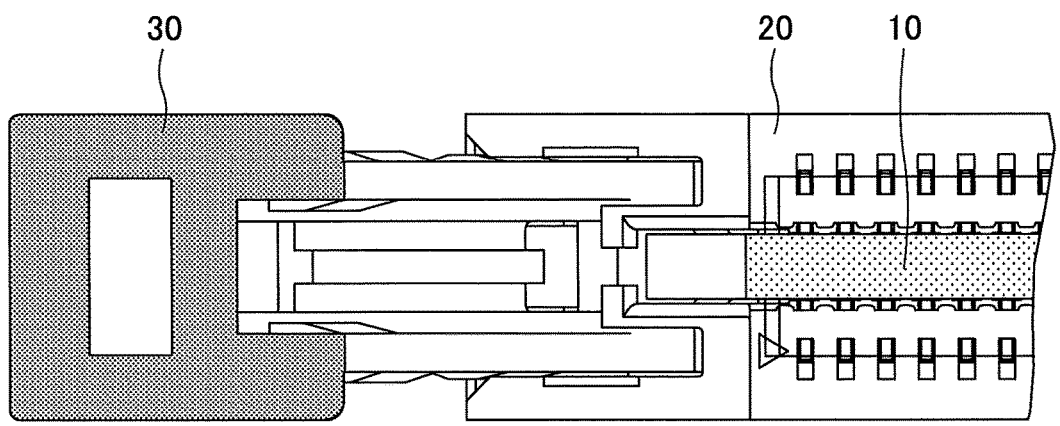
FIG. 10 is a view for describing the step of attaching the substrate to the card edge connector.

FIG. 8A to FIG. 10 illustrate a state in which the module substrate 10 is about to be inserted in the opening 22. FIG. 8A is an elevation view, FIG. 8B is a cross-sectional view taken along a plane that is parallel with a surface of the module substrate 10 and FIG. 9 is a perspective view, of this state. FIG. 10 is a cross-sectional view taken along a chain line 8A-8B in FIG. 8A.

At this state, the latches 30 are opened, the lower end 10a of the module substrate 10 contacts a front edge of the support 34 of each of the latches 30.

Figure 12:
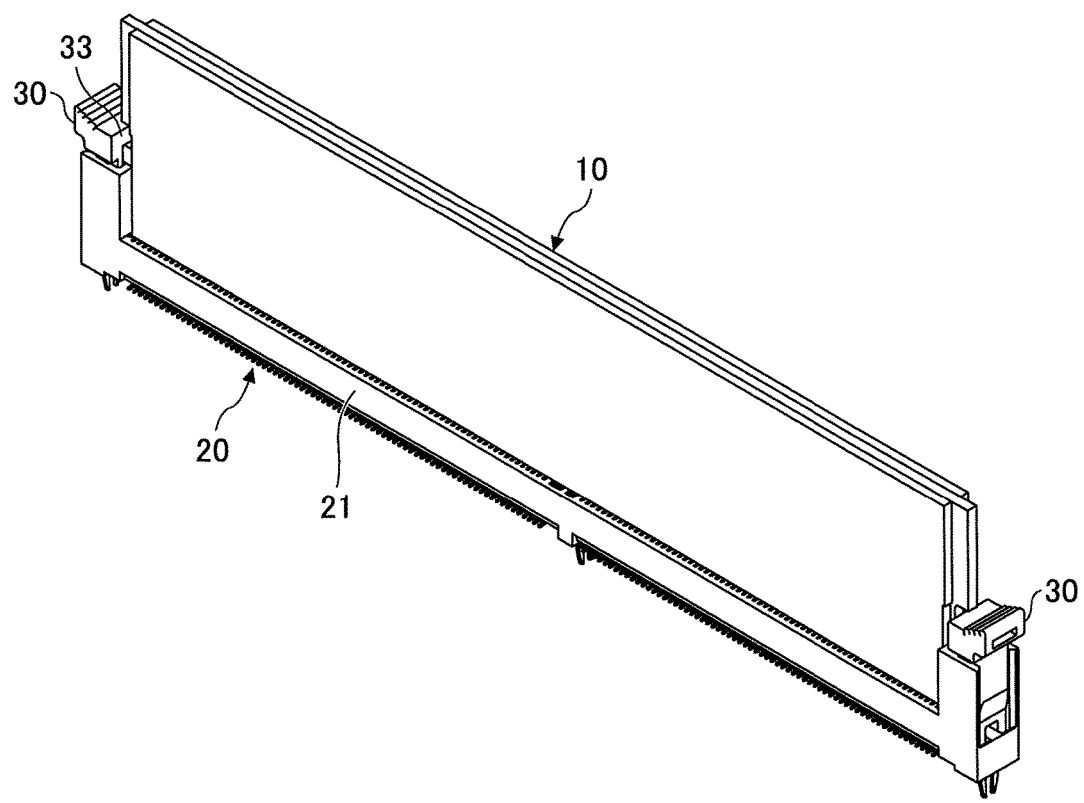
FIG. 12 is a view for describing the step of attaching the substrate to the card edge connector.
Figure 13:
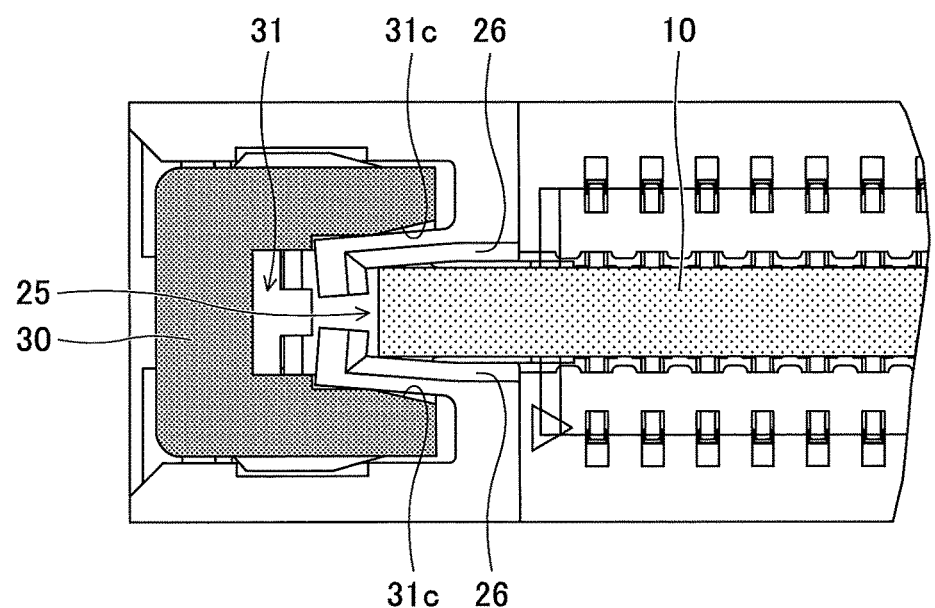
FIG. 13 is a view for describing the step of attaching the substrate to the card edge connector.

Thereafter, by further inserting the module substrate 10 into the opening 22, the contact terminals 23 provided at the opening 22 contact the corresponding electrode pads 11 of the module substrate 10, respectively, to be electrically connected with each other. At this time, the front edge of the support 34 of each of the latches 30 is pressed by the lower end 10a of the module substrate 10 and is rotated around a center of the concave portion 35 as an axis. Then, as illustrated in FIG. 11A to FIG. 13, the presser 33 of each of the latches 30 enters the respective notch 12, and the module substrate 10 inserted in the opening 22 is fixed to the card edge connector 20. FIG. 11A is an elevation view, FIG. 11B is a cross-sectional view taken along a plane that is parallel with a surface of the module substrate 10 and FIG. 12 is a perspective view, of this state. FIG. 13 is a cross-sectional view taken along a chain line 11A-11B in FIG. 11A.

As such, under the state that the module substrate 10 is inserted in the opening 22 and fixed, the lower end 10a of the module substrate 10 is supported by the supports 34, and the presser 33 of each of the latches 30 enters the respective notch 12 so that a lower side of the notch 12 is supported by the presser 33.

Further, at this time, as illustrated in FIG. 13, projections 31c of the latch 30 that are side walls at both sides of the concave portion 31 press outside of the sidewalls 26, respectively, and the sidewalls 26 press a portion of the module substrate 10 that enters the guide groove 25 to support the module substrate 10.

However, as described above with reference to FIG. 6A and FIG. 6B, the guide groove 25 is formed to have wider width at its upper side so that the module substrate 10 can be easily inserted in the guide groove 25. Thus, at the upper side of the guide groove 25, force of the sidewalls 26 for supporting the module substrate is not sufficient. Further, as illustrated in FIG. 11A and FIG. 11B, the card edge connector 20 supports a lower side of the module substrate 10. Thus, when vibration, impacts and the like are applied to a motherboard of a personal computer, in particular, when vibration, impacts and the like are applied in a penetrating direction of FIG. 11A or FIG. 11B, the contact terminals 23 and the electrode pads 11 may be momentarily disconnected, and there is a risk that data cannot be accurately transmitted in a device such as a personal computer in which the card edge connector 20 is provided.

(Card Edge Connector of Embodiment)

Figure 14:
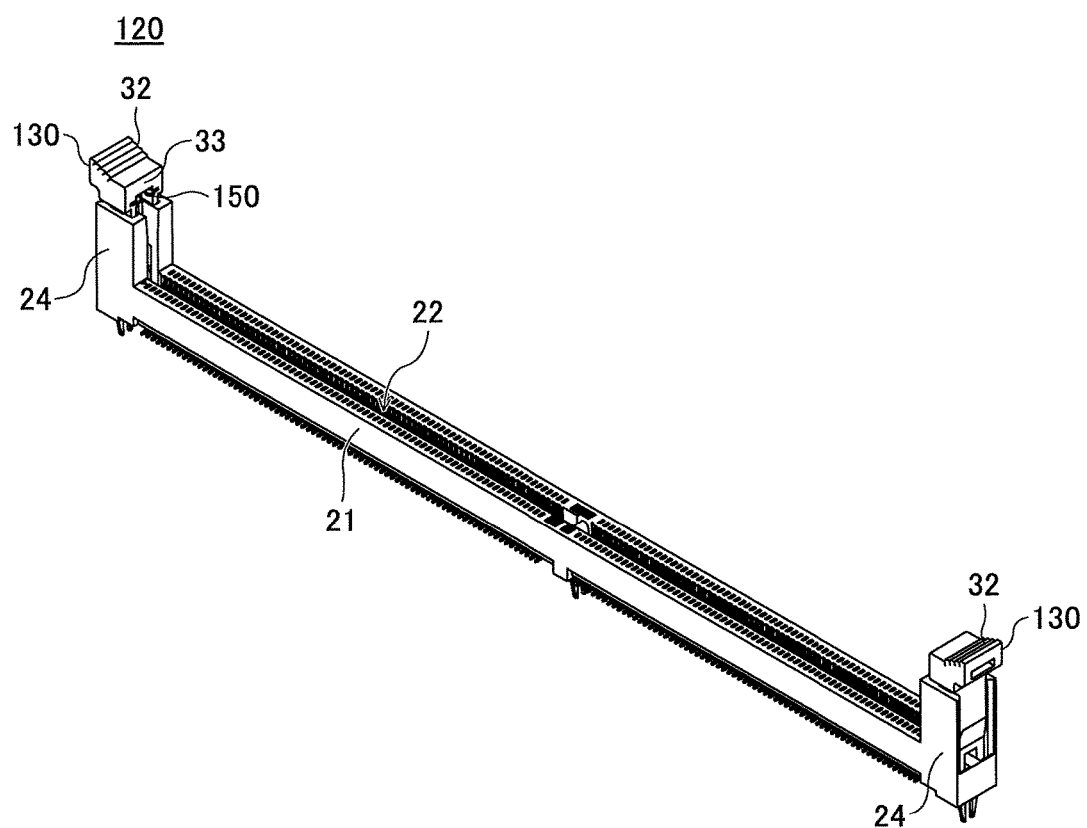
FIG. 14 is a perspective view of a card edge connector.

Next, a card edge connector of the embodiment, which is an example of a connector, is described. FIG. 14 to FIG. 16 are views illustrating an example of a card edge connector 120 of the embodiment.

FIG. 14 is a perspective view of the card edge connector 120. The card edge connector 120 includes the connector body 21 provided with the opening 22, the guide posts 24 each having a square pole shape and latches 130. The connector body 21, the opening 22 and the guide posts 24 are the same as those of the above described card edge connector 20.

Figure 15A:
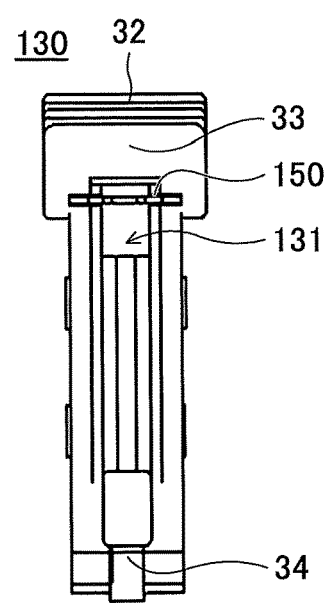
FIG. 15A and FIG. 15B are views for describing a latch of the card edge connector.
Figure 15B:
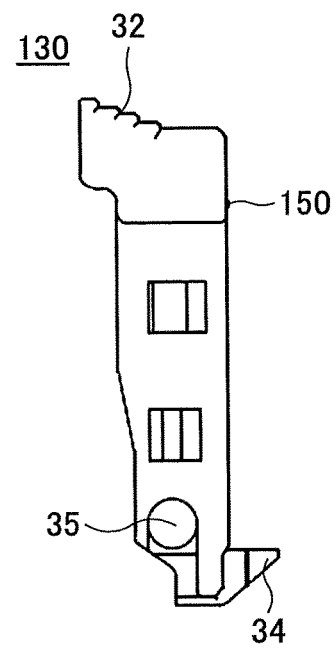
Figure 16:
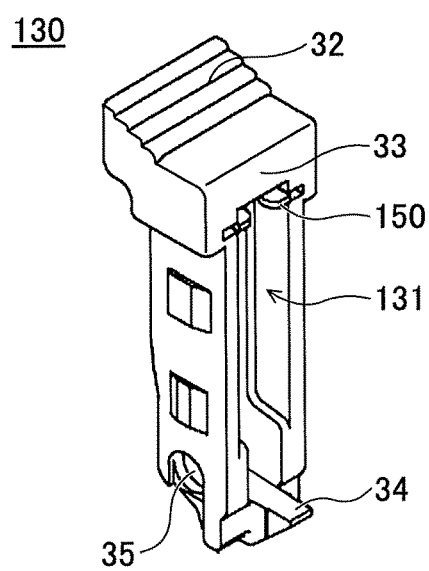
FIG. 16 is a perspective view of the latch.

FIG. 15A is a side view seen from a module substrate 10 side, FIG. 15B is an elevation view and FIG. 16 is a perspective view, of the latch 130. Each of the latches 130 includes the operation portion 32, the presser 33, a concave portion 131, the support 34, the concave portion and a lock plate 150. The operation portion 32, the presser 33, the support 34 and the concave portion 35 are the same as those of the above described latch 30. The lock plate 150 is attached at an upper side of the concave portion 131 of each of the latches in this embodiment.

Figure 17A:
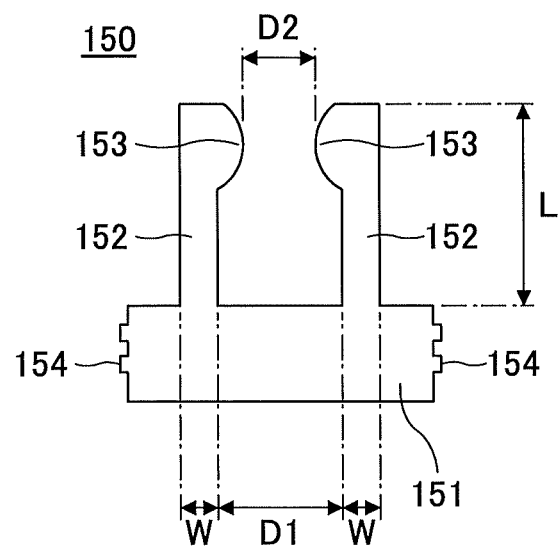
FIG. 17A and FIG. 17B are views for describing a lock plate the embodiment.
Figure 17B:
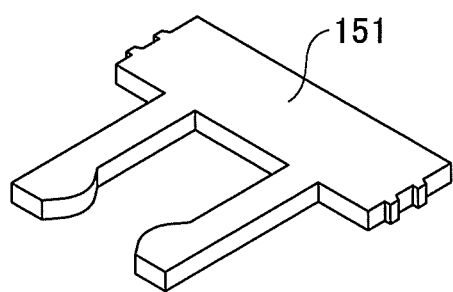

FIG. 17A is a top view and FIG. 17B is a perspective view, of the lock plate 150.

The lock plate 150 is made of a metal having elasticity such as phosphor bronze. The lock plate 150 includes a plate body 151 and two arms 152. The arms 152 are formed to extend from one of the longitudinal sides of the plate body 151 in a direction perpendicular to a longitudinal direction of the plate body 151. Supports 153 are provided at the arms 152 near a front edge of the arms 152, respectively, to face with each other. Convexo-concave portions 154 for fixing the lock plate 150 to the latch 130 are provided at both edges of the plate body 151.

The thickness of the lock plate 150 is approximately 0.2 mm, and the length "L" of the arms 152 is approximately 2 mm. The width "W" of the arms 152 is approximately 0.5 mm, a distance "D1" between the two arms 152 near the plate body 151 is approximately 1.6 mm, and a distance "D2" between the two supports 153 is approximately 1.2 mm. The supports 153 are provided to support the module substrate 10 from both surfaces of the module substrate 10 so that the supports 153 are formed to protrude from the arms 152 that are facing with each other. The distance "D2" between the two supports 153 is formed to be narrower than the thickness of the module substrate 10.

The lock plate 150 may be formed by a resin material having elasticity. However, it is preferable to form the lock plate 150 by a metal because the rigidity of the lock plate 150 becomes high and the lock plate 150 can surely support the module substrate 10 in such a case, as will be described later.

Figure 18A:
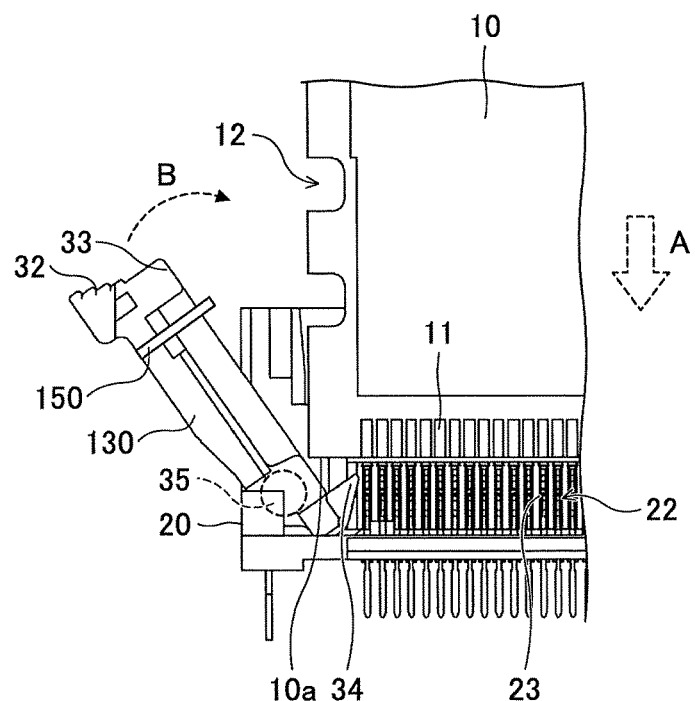
FIG. 18A and FIG. 18B are views for describing steps of attaching the substrate to the card edge connector.

Next, steps of inserting the module substrate 10 into the card edge connector 120 are described. First, the latches 130 are opened at a second position, and the lower end 10a of the module substrate 10 at which the electrode pads 11 are provided is inserted in the opening 22. FIG. 18A is a view illustrating an inside of the opening under a state in which the module substrate 10 is about to be inserted. The module substrate 10 is inserted in the opening 22 in a direction indicated by a broken line arrow "A".

Thereafter, by inserting the module substrate in the opening 22, the lower end 10a of the module substrate 10 contacts a front edge of the support 34 of each of the latches 130. Then, the front edge of the support 34 is pressed by the lower end 10a, and each of the latches 130 is rotated around a center of the concave portion 35 as an axis in a direction indicated by a broken line arrow "B".

Figure 18B:
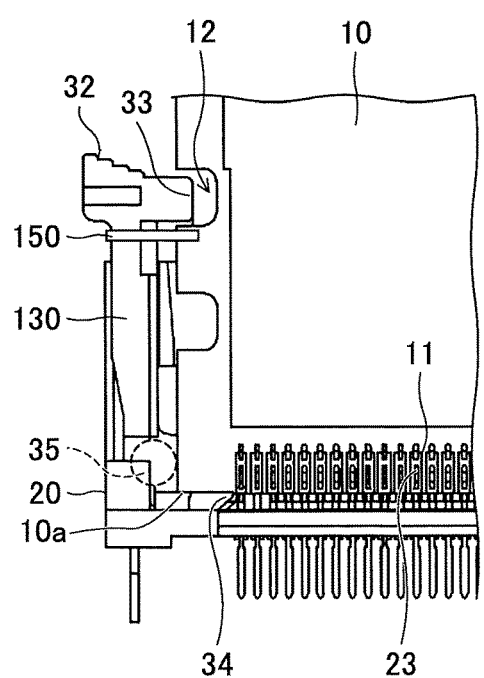

Then, as illustrated in FIG. 18B, the presser enters the respective notch 12. At this time, the module substrate 10 is sandwiched between the two arms 152 extending from the plate body 151 and the latches 130 are closed at a first position.

Figure 19:
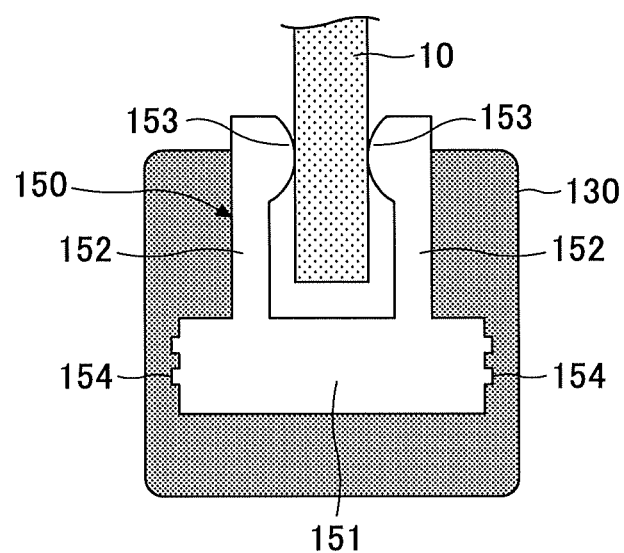
FIG. 19 is a view for describing the card edge connector.
Figure 20:
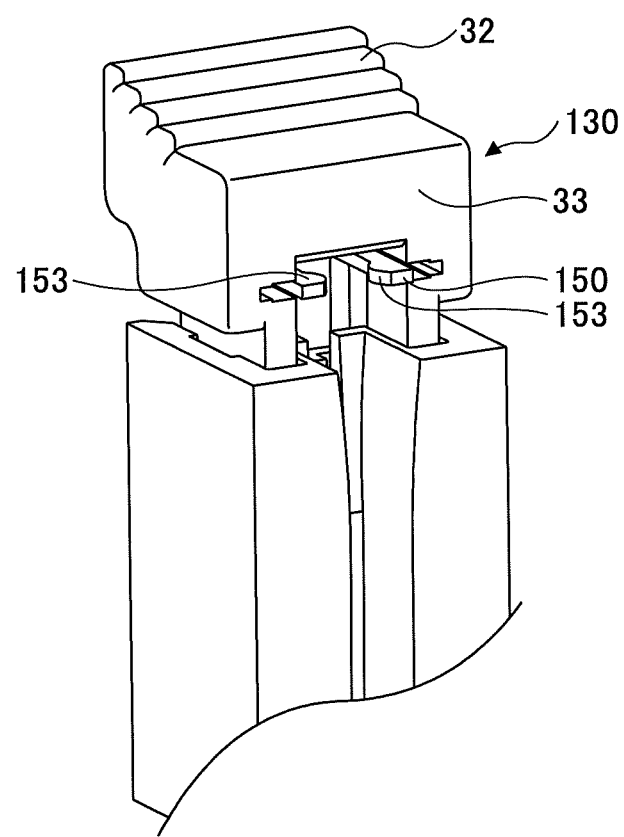
FIG. 20 is a view for describing the card edge connector.

FIG. 19 is a cross-sectional view illustrating a state in which the module substrate 10 is sandwiched between the arms 152. FIG. 20 is a perspective view illustrating the card edge connector 120 under this state. The module substrate 10 is not illustrated in FIG. 20 for explanation purposes.

As described above, the distance "D2" between the two supports 153 is approximately 1.2 mm when the module substrate 10 is not sandwiched therebetween, while the thickness of the board of the module substrate 10 is 1.3 mm to 1.5 mm. Thus when the module substrate 10 is sandwiched between the supports 153, the arms 152 are deformed, and restoring forces are generated in directions in which the supports 153 push the module substrate 10, respectively.

Thus, both surfaces of the module substrate are sandwiched by the supports 153 and the module substrate 10 is strongly supported by the restoring forces of the arms 152. Thus, even when vibrations or impacts are generated, the module substrate 10 moves with the card edge connector 120, and the contact terminals 23 and the electrode pads 11 are not separated from each other, respectively. Thus, of data can be appropriately transmitted.

Figure 21:
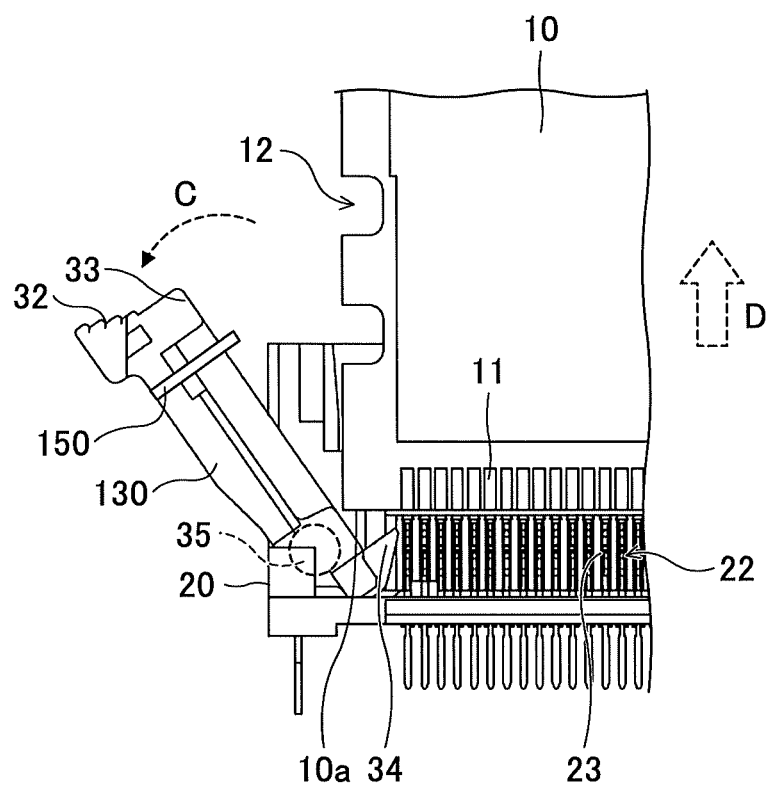
FIG. 21 is a view for describing a step of detaching the substrate from the card edge connector.

When detaching the module substrate 10 from the card edge connector 120, each of the operation portions 32 is pressed downward. With this, as illustrated in FIG. 21, the latch 130 is rotated around the concave portion 35 as an axis in a direction expressed by a broken line arrow C. Then, the supports 153 are moved away from the module substrate 10, the presser 33 of each of the latches 130 is detached from the respective notch 12, and further, the lower end 10a of the module substrate 10 is risen up by the support 34 of each of the latches 130 in a direction indicated by a broken line arrow D. At this time, the latches 130 are opened again at the first position. With this, the module substrate 10 can be detached from the card edge connector 120.

According to the connector of the disclosure, electrical disconnection between electrode pads of the module substrate and contact terminals of the card edge connector can be prevented even when vibration is generated in the personal computer or an impact is applied to the personal computer.

Although an embodiment of the connector has been specifically illustrated and described, it is to be understood that the present invention is not limited to the specifically disclosed embodiments, and minor modifications may be made therein without departing from the spirit and scope of the invention as defined by the claims.

What is claimed is:

1. A connector comprising:
   a connector body including an opening to which a substrate is to be inserted, said substrate having a notch provided at a side thereof;

guide posts provided at both sides of the connector body; and latches being rotatably connected to the guide posts, respectively, wherein each of the latches includes
- a lock plate including two arms and formed of a single flat plate member extending on a same plane and configured to support the substrate from both surfaces of the substrate, when the substrate is inserted in the opening, and
- a presser configured to enter the notch above the lock plate supporting the substrate.

2. The connector according to claim 1, wherein each of the latches is configured to rotate to take a first position and a second position, and wherein the lock plate supports the substrate from the both sides of the substrate, and the presser enters the respective notch, at the first position, when the substrate is inserted in the opening.

3. The connector according to claim 2, wherein when each of the latches is rotated from a state in which the substrate is inserted in the opening and each of the latches takes the first position to take the second position, the lock plate of each of the latches is moved away from the substrate, and the presser is detached from the respective notch.

4. The connector according to claim 1, wherein each of the two arms is provided with a support near a front edge of the respective arm, and wherein the supports are configured to contact the both surfaces of the substrate, respectively, when the substrate is inserted in the opening.

5. The connector according to claim 1, wherein lock plate includes only one pair of arms to support the substrate and the presser is arranged above the lock plate in a direction opposite to a direction in which the substrate is inserted to the opening of the connector body.

6. The connector according to claim 1, wherein the lock plate is arranged so as to protrude from the presser toward the substrate.

7. The connector according to claim 1, wherein the lock plate is made of resin.

* * * * *